United States Patent [19]

Desu et al.

[11] Patent Number: 5,790,366

[45] Date of Patent: Aug. 4, 1998

[54] HIGH TEMPERATURE ELECTRODE-BARRIERS FOR FERROELECTRIC AND OTHER CAPACITOR STRUCTURES

[75] Inventors: Seshu B. Desu; Hemanshu D. Bhatt, both of Blacksburg, Va.; Dilip P. Vijay, Fremont, Calif.; Yoosang Hwang, Yongin, Rep. of Korea

[73] Assignees: Sharp Kabushiki Kaisha, Osaka, Japan; Virginia Tech Intellectual Properties, Blacksburg, Va.

[21] Appl. No.: 763,011

[22] Filed: Dec. 6, 1996

(Under 37 CFR 1.47)

[51] Int. Cl.$^6$ .................................................. H01G 4/008
[52] U.S. Cl. .................. 361/305; 361/511; 361/313; 361/322; 257/295; 257/306
[58] Field of Search .................................. 361/303, 305, 361/306.3, 311, 312, 313, 301.4, 301.5, 321.1, 321.2, 321.4, 321.5, 322, 330; 257/192, 295, 306, 310, 296, 392, 301, 307, 311, 309; 438/253, 254, 255, 240, 238, 397, 389, 396

[56] References Cited

U.S. PATENT DOCUMENTS

| | | | |
|---|---|---|---|
| 5,003,428 | 3/1991 | Shepherd | 361/322 |
| 5,005,102 | 4/1991 | Larson | 361/313 |
| 5,142,437 | 8/1992 | Kammerdiner et al. | 361/313 |
| 5,185,689 | 2/1993 | Maniar | 361/313 |
| 5,555,486 | 9/1996 | Kingon et al. | 361/305 |

Primary Examiner—Kristine L. Kincaid
Assistant Examiner—Anthony Dinkins
Attorney, Agent, or Firm—Davis, Graham & Stubbs LLP

[57] ABSTRACT

A capacitor for use on silicon or other substrate has a multilayer electrode structure. In a preferred embodiment, a bottom electrode situated on the substrate has a bottom layer of Pt—Rh—$O_x$, an intermediate layer of Pt—Rh, and a top layer of Pt—Rh—$O_x$. A ferroelectric material such as PZT (or other material) is situated on the bottom electrode. A top electrode, preferably of identical composition as the bottom electrode, is situated on the opposite side of the ferroelectric from the bottom electrode.

14 Claims, 5 Drawing Sheets

| |
|---|
| 150 |
| 140 |
| 130 |
| 120 |
| 110 |
| 100 |
| 90 |
| 80 |

| 60 |
|---|
| 50 |
| 40 |
| 30 |
| 20 |
| 10 |
| 8 |

PRIOR ART

FIG.1A

| 120 |
|---|
| 110 |
| 100 |
| 90 |
| 80 |

FIG.1B

| 150 |
|---|
| 140 |
| 130 |
| 120 |
| 110 |
| 100 |
| 90 |
| 80 |

FIG.1C

HIGH TEMPERATURE ELECTRODE-BARRIERS FOR FERROELECTRIC AND OTHER CAPACITOR STRUCTURES

FIELD OF THE INVENTION

The present invention relates to the field of ferroelectric capacitors and memory devices, and more particularly to a stacked electrode structure applicable to such devices.

BACKGROUND OF THE INVENTION

Ferroelectric capacitors have attracted considerable attention as a potential source of non-volatile memory. Expected benefits are high read/write speed and cycle capacity, and low voltage requirements, compared to, for example, flash EEPROMS. Researchers have previously developed a 0.5 µm ferroelectric memory cell technology, and even smaller memory cells. See S. Onishi et al., "A Half-Micron Ferroelectric Memory Cell Technology with Stacked Capacitor Structure," IEDM Digest of Technical Papers, p. 843 (1996); K. Shoji et al., "A 7.03 µm$^2$Vcc/2-plate Nonvolatile DRAM Cell With a Pt/PZT/Pt/TiN Capacitor Patterned by One-Mask Dry Etching," VLSI Tech. Symp. Digest of Technical Papers, p. 28 (1996). (The contents of all documents referred to herein are incorporated by reference.) These memory cells have used a Pt/TiN/Ti polysilicon plug structure for the capacitor bottom electrode. A notable drawback of this structure has been oxidation of TiN surface and subsequent peeling of Pt from TiN. This occurs during ferroelectric film formation at high temperatures as a result of Oxygen penetration to the TiN surface through the Pt layer. Since a temperature higher than about 600°–700° C. (which is a "high temperature" as used herein) is requisite to obtain highly reliable ferroelectric films such as lead zirconate titanate (PZT) or SrBi$_2$Ta$_2$O$_9$ (SBT), the development of a highly stable electrode structure is a key issue to achieve advanced ferroelectric memories.

Platinum (Pt) has been the material of choice as a thin film electrode because of its excellent electrical conductivity, thermal and chemical stability, and good adhesion with ferroelectric layers. However, Pt reacts with Si at fairly low temperatures (less than about 400° C.) to form a silicide layer. Thus, it is necessary to have a SiO$_2$ barrier layer between the Pt electrode and Si substrate to prevent silicide formation and subsequent Si diffusion to the ferroelectric layer. In addition to the SiO$_2$ layer, and additional layer of Ti has been used to improve the adhesion between the Pt and SiO$_2$ layers. Even with the Ti interlayer, hillock like formations are commonly observed on the surface of the Pt films due to the thermal expansion mismatch between Pt and Si, during their high temperature processing. These hillocks can be fairly large (between about 50–100 nm) and can be extremely detrimental to the properties of the ferroelectric films. Further, it is well known that PZT capacitors with Pt electrodes show a severe progressive decrease in the switching charge with increasing switching cycles, i.e., polarization fatigue. This fatigue has been attributed, among other reasons, to the domain pinning by the accumulation of space charge at the PZT/Pt interface. Replacement of the Pt electrode with conducting oxide electrodes, namely RuO$_2$, La$_{1-x}$Sr$_x$O$_3$(LSCO), YBa$_2$,Cu$_3$O$_{7-x}$(YBCO), etc., has served in minimizing this problem to an extent. This improvement has been attributed to a reduced build up of charged defects at the PZT/oxide interface as well as a better work function match with PZT. However, oxide electrode/PZT capacitors show significantly higher leakage currents as compared to the Pt/PZT capacitors.

Multilayer conducting oxide/metal electrodes have been investigated for improving simultaneously the fatigue as well as the leakage current properties for PZT thin films. Previous work has shown LSCO/Pt, RuO$_2$/Pt, and IrO$_2$/Ir to have some promise in reducing fatigue and leakage current properties. However, the leakage current values are still higher than for Pt, and must be improved. Polarization has been poor in some cases.

The electrode system for memory applications must have desired electrical and ferroelectric properties. Further, the electrode must be able to be integrated within the design of the memory cell structure. In particular, large scale integration requires that the electrode of a capacitor be in direct electrical contact with the source/drain of a transistor in a one transistor-one capacitor single memory cell. Requirements for such an electrode are that it should:

remain electrical conductive after exposure to oxidizing environment at high temperatures, prevent oxygen/mobile component of the ferroelectric film diffusion to the underlying substrate thereby preserving the electrical characteristics of the transistor, prevent diffusion of Si to the electrode surface during processing, and have no interaction (reaction) with the ferroelectric as well as the substrate during processing at high temperatures. Pt electrodes and conductive oxide/metal electrodes do not meet at least one of the above requirements and so cannot be effectively used in such a configuration. Ferroelectric systems using PZT and SBT, and also high dielectric materials such as BST in conjunction with a Pt/TiN/Ti/Polysilicon plug for NVRAM cell structure and with RuO2/TiN for DRAM applications have been investigated. However, during processing at high temperatures, such as greater than about 500° C., the TiN layer is easily oxidized causing an increase in the electrode resistance and peeling of the Pt layer due to changing stress states of the Pt/TiN layer.

An electrode system satisfying the above (and other) criteria is believed to be unknown in the prior art. The present invention provides such a device, and hence represents a significant advance in the art.

SUMMARY OF THE INVENTION

The present invention is a capacitor particularly suited for ferroelectric memories and DRAMs, as well as other applications. The capacitor is formed on a substrate such as silicon, and may be placed, as one application, in electrical contact with the source/drain of a transistor to form a memory cell for large scale device integration.

In one embodiment, the bottom electrode structure is composed of three layers, which together form an electrode and diffusion barrier between the substrate and ferroelectric (or other capacitor dielectric). A bottom layer (closest to the substrate) is a metal oxide formed of Pt—Rh—O$_x$. An intermediate layer is formed of metal Pt—Rh. A top layer (closest to the ferroelectric) is formed of Pt—Rh—O$_x$.

A layer of ferroelectric is deposited on this bottom electrode structure.

A top electrode is deposited on the ferroelectric to complete the capacitor. Preferably, the top electrode is formed identically to the bottom electrode. That is, a layer of Pt—Rh—O$_x$ is formed directly on the ferroelectric. A layer of Pt—Rh is formed there-above. A layer of Pt—Rh—O$_x$ is formed there-above to complete the capacitor structure.

Other embodiments as set forth below are included within the scope of the present invention.

The device is preferably formed by RF sputtering, as set forth below. However, it may be formed by any other deposition technique, including, for example, any chemical vapor deposition or sol-gel or physical vapor deposition process.

A capacitor according to the present invention has excellent ferroelectric and fatigue characteristics. Further, the electrode acts as an excellent barrier between the ferroelectric and substrate up to high processing temperatures, such as 700° C.

BRIEF DESCRIPTION OF THE DRAWINGS

FIG. 1A is a schematic of a bottom electrode and ferroelectric capacitor on a substrate, according to conventional design.

FIG. 1B is a schematic of a bottom electrode and ferroelectric capacitor on a substrate, according to an embodiment of the present invention.

FIG. 1C is a schematic similar to FIG. 1B additionally showing a top electrode.

DETAILED DESCRIPTION OF THE INVENTION

Figure 2:
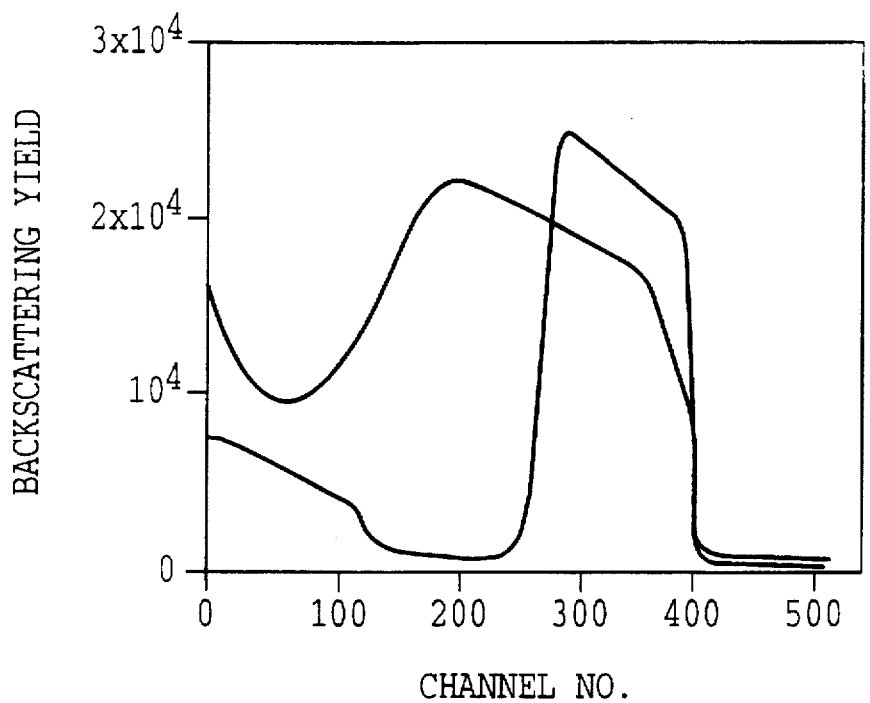
FIG. 2 is a graph of RBS spectral for an electrode film according to the present invent(on and for a Pt film, on a substrate.

The present invention is a device structure primarily useful as a capacitor in a ferroelectric memory, and more particularly of the type in which a capacitor electrode is in direct electrical contact with the source/drain of a transistor through a polysilicon plug. Prior art devices have used separate electrode and diffusion barrier layers requiring deposition of four or five different layers.

For example, the prior art device of FIG. 1A has a separate electrode and diffusion layer. A silicide ($TiSi_2$ or $TaSi_2$) layer 10 is deposited on a polysilicon plug 8. A layer of $Ti_2O$ (or Ta) is deposited on the silicide layer 10. A layer of TiN 30 is deposited on layer 20. A layer of Pt 40 is deposited on layer 30. A layer of $RuO_2$ (or LSCO or $IrO_2$) 50 is deposited on layer 40. Layers 20–50 form a bottom electrode structure, on which ferroelectric material such as PZT 60 is deposited. As used herein, PZT encompasses undoped and any doped variant, including doping of Pb, Zi, and Ti. The device can be situated within a substrate and integrated into a device. Pt layer 40 and $RuO_2$ layer 50 are a metal and conducting oxide theat improve degradation properties of PZT ferroelectric capacitors. $TiSi_2$ layer 10, Ti layer 20, and TiN layer 30 form a diffusion barrier. The overall device is relatively complex, requiring the deposition of four of five different layers; however, such a design is required due to constraints of diffusion, oxidation resistance, and adhesion. Even with the complexity, the device suffers from adhesions problems and TiN layer 30 oxidation for processing temperatures greater than about 500° C.

A bottom electrode device according to the present invention is shown in FIG. 1B. The electrode is based on a three layer structure Pt—Rh—$O_x$/Pt—Rh/Pt—Rh—$O_x$. A bottom metal oxide layer of Pt—Rh—$O_x$ 90 is deposited on a substrate 80. An intermediate metal layer of Pt—Rh 100 is deposited on the layer 90. A top metal oxide layer of Pt—Rh—$O_x$ 110 is deposited on the intermediate layer 90. A ferroelectric layer such as PZT 120 is deposited on the metal layer 110. It should be understood that the layers 90, 100, and 110 together form a bottom electrode of a capacitor device.

The above device was formed in an in-situ sputtering process. The bottom oxide layer 90 is sputtered in an argon (Ar) and oxygen ($O_2$) ambient. The metal layer 100 is sputtered in pure Ar. The top layer 110 is sputtered in an Ar and $O_2$ environment. An RF sputter system from Cooke Vacuum Products was used.

A target of Pt-10% Rh alloy was used, with dimensions of a 2 inch diameter and a thickness of 0.125 inches. The electrodes were deposited at a substrate temperature of 450° C. at a RF power of 50 W (about 16 W/in$^2$ power density). The gas pressure used was 5 mTorr for pure Ar sputtering and 7 mTorr for sputtering in Ar and $O_2$. Ar and $O_2$ sputtering was performed with an Ar:$O_2$ ration kept constant at 20:4 sccm. The deposition times were 3 minutes for the bottom layer 90, 17 minutes for the intermediate layer 100, and 6 minutes for the top layer 110. The bottom electrode structure was deposited on a substrate 80 of single crystal n+Si(100). Additionally, alternative embodiments were constructed with a substrate 80 of n+polysilicon/$SiO_2$/Si; and of $SiO_2$/Si.

The substrate 80 was cleaned and degreased for any surface contamination. The native oxide on the single crystal Si and poly Si substrates was removed and the surface H-passivated by using a HF acid treatment. The substrates were then immediately transferred to the sputter chamber for bottom electrode deposition to minimize any native oxide formation. Following the bottom electrode deposition, MOD derived PZT film of the composition $PbZr_{0.53}Ti_{0.47}O_3$ was deposited from a metallorganic precursor. See G.Yi and M. Sayer, Ceram Bull., 70, 1173 (1991) for preparation details. The thickness of the PZT film was determined by spectroscopic ellipsometry to be approximately 3000 Å. The films were then annealed at 650° C. for 30 minutes in a quartz tube furnace under flowing oxygen to accomplish crystallization of the perovskite phase in the PZT film. Next, the top electrode was deposited, the top electrode being a Pt—Rh/Pt—Rh—$O_x$/Pt—Rh layer. More particularly, a Pt—Rh—$O_x$ layer 130 is deposited on the ferroelectric layer 110. A metal Pt—Rh layer 140 is deposited above layer 130. Finally, a top Pt—Rh—$O_x$ layer 150 is deposited above layer 140. The top electrode comprises layers 130—150. The top electrode was deposited under identical vapor deposition conditions as the bottom electrode, although other conditions could be used. Afterwards, the structure was annealed at 600° C. for 30 minutes. The top electrode are was approximately $3.0 \times 10^{-4}$ cm.

The composition and thickness of the electrode films was determined using Rutherford Backscattering Spectroscopy (RBS). Phase formation and orientation of the PZT film was studied using X-ray diffraction (XRD). The morphology of the films was examined using atomic force microscopy (AFM). The ferroelectric properties (hysteresis and fatigue) of the capacitor structures were determined by using the RT66A ferroelectric tester form Radian Technologies of Albuquerque, NM). The direct current (dc) leakage current was determined using a Kiethley 617 programmable electrometer. The electrometer was programmed to measure the steady state leakage current as a function of applied voltage.

Results of the RBS studies on the as deposited electrode films on $SiO_2$/Si substrates confirmed the oxide layer formation as the surface (i.e., top layer of top electrode) and the electrode/substrate interface (i.e., bottom layer of bottom electrode) due to the reactive sputtering. The composition of each layer in the electrodes were determined by fitting a theoretical spectra using a simulation program to the experimental spectrum until a close match was obtained. The RBS simulation results confirm that there are three distinct layers in the deposited films. The bottom layer adjacent to the $SiO_2$ layer is an oxide layer having the atomic composition Pt:Rh:O=66:14:20. The intermediate layer is a metal layer of composition Pt:Rh=87:13. The top oxide layer is an oxide layer having the composition of Pt:Rh:O=50:20:30. The thickness of these layers corresponding to the deposition times set forth above was determined to be 15 nm, 50 nm, and 30 nm for the bottom layer, intermediate layer, and top layer respectively.

The intermediate metal layer deposited in pure Ar atmosphere was enriched in Rh, at 13%, compared to the target, Rh of 10%, possibly due to the preferential sputtering of Rh as compared to Pt. Based on the composition results, it has not been determined whether the film completely mixed oxide film or a mixture of metal and oxide components. Both Rh and Pt form conductive oxides, ($RhO_x$ and $PtO_2$, however, Rh has a higher affinity for oxygen and is likely to be oxidized to a greater extent as compared to Pt. This can result in the preferential segregation of Rh in the oxide layers as compared to the metallic layer as observed in our case. The resistivity of the multilayer electrode-barrier films measured using the four point probe was determined to be in the range of 18–24 µOhm-cm, indicating that the multi layer electrodes had comparable resistivities to the metallic films.

Figure 3:
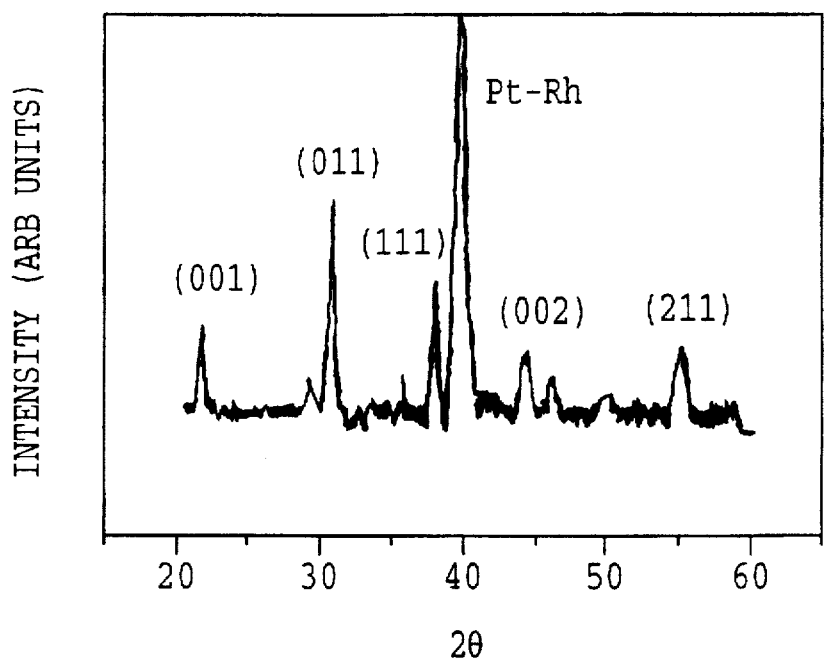
FIG. 3 is an XRD pattern of a ferroelectric (PZT) film deposited on an electrode barrier and substrate according to the present invention, after annealing.

FIG. 2 shows the RBS spectra of the multilayer electrode film as well as Pt film on $n^+$Si substrate after annealing at 700° C. for 60 minutes in flowing $O_2$. The results clearly demonstrate that there is not significant interdiffusion between the Pt—Rh and Si, as compared to the Pt/Si case (both the Pt and Si edges have shifted considerably). This indicates that the Pt—Rh—$O_x$ layer acts as an effective diffusion/reaction barrier up to processing temperatures of at least 700° C. XRD analysis of the as deposited electrode films indicate the formation of crystalline Pt—Rh electrode structure under these deposition conditions. The XRD data for the multilayer electrode films deposited on Si substrate did not show any new peaks as compared to Pt corresponding to Pt/Rh silicides after annealing at 650° C., demonstrating the barrier effect of the Pt—Rh—$O_x$ layer. Morphological examination of the electrodes using the AFM showed that the electrodes have a fine and a very fine grained structure with an average grain size of approximately 400 Å. In addition, no hillock formation was observed for these electrodes after annealing at 650° C. and the average surface roughness (Ra) determined from the AFM data was only 0.68 nm. FIG. 3 shows the XRD pattern for the PZT film deposited on the bottom electrode/Si(100) structure and annealed at 650° C. for 30 min in $O_2$ atmosphere. As observed from the XRD pattern, it appears that the films have predominantly crystallized in the ferroelectric perovskite phase. The absence of any peaks of the pyrochlore phase implies that the remaining pyrochlore phase is within the detectable limits of the XRD technique. The films do not appear to have preferred orientation. The PZT films have an average grain size of approximately 800 Åas observed from the AFM micrographs.

It is important to note that the extreme smoothness of the PZT films which have an average roughness Ra value of only 1.31 nm due to the smooth and fine grained texture of the underlying electrodes, Ra=0.62 nm. In comparison, films deposited on Pt electrodes tend to be much rougher and also have a larger grain size, such as greater than 1000 ÅThis is due to the larger grain size and hillock formation of the under lying Pt electrodes. See J. O. Olowolfe et al., J. App. Phy., 73, 1764 (1993). Therefore, the multilayer electrodes according to the present invention has a significant advantage when used for thinner films of PZT compared to the Pt electrodes.

Figure 4A:
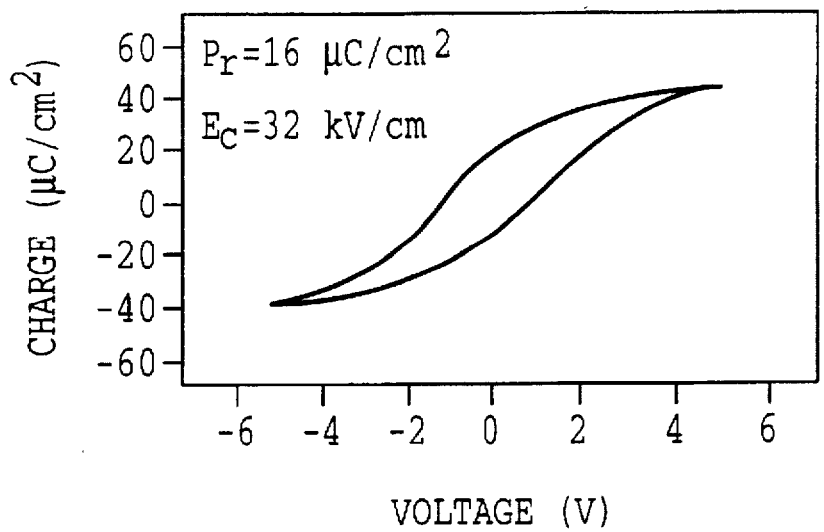
FIG. 4A is hysteresis curve of a capacitor according to the present invention.
Figure 4B:
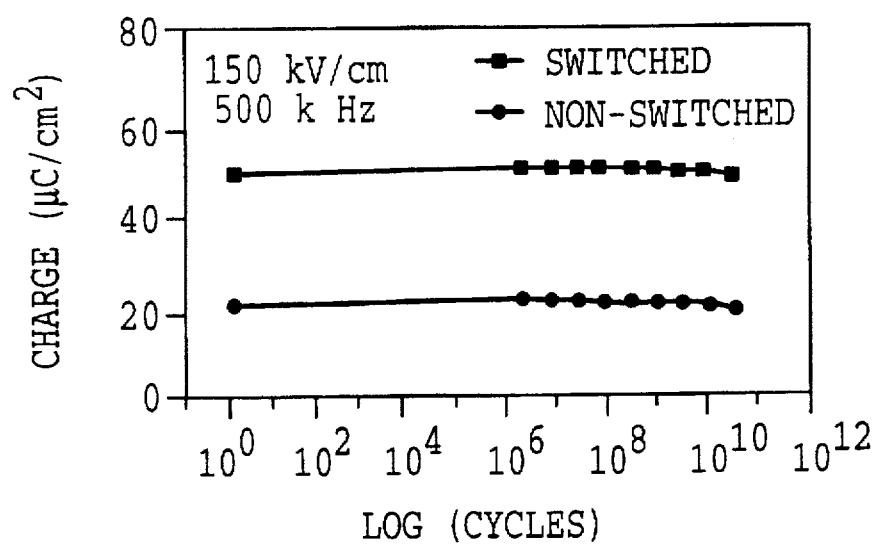
FIG. 4B is a fatigue plot of a capacitor according to the present invention.

FIGS. 4A and 4B show the typical hysteresis curve and the fatigue behavior of the top electrode/PZT/bottom electrode structures of the invention deposited directly on n+Si (100) substrate annealed at 650° C. for 30 minutes in $O_2$. The hysteresis loop for these test structures is well saturated and shows the remanent polarization (Pr) value of around 16 $\mu C/cm^2$. The coercive fields (Ec) are also low, falling in the range 30–40 kV/cm. The Pr and Ec values for the capacitors deposited on n+poly Si/$SiO_2$/Si, and $SiO_2$/Si, structures fell within the same range. The Pr values for PZT films deposited on the multilayer electrodes are lower than the films deposited on Pt electrodes possibly due to the smaller grain size of the PZT.

Fatigue tests were performed using an externally generated square wave with an amplitude of ±5 V and a frequency of 500 kHz. In FIG. 4B, the switched and unswitched charge is plotted as a function of log cycles applied to the capacitors. Results of the fatigue testing show that there is no significant fatigue (polarization less than 5%) up to $10^{11}$ cycles.

Figure 5:
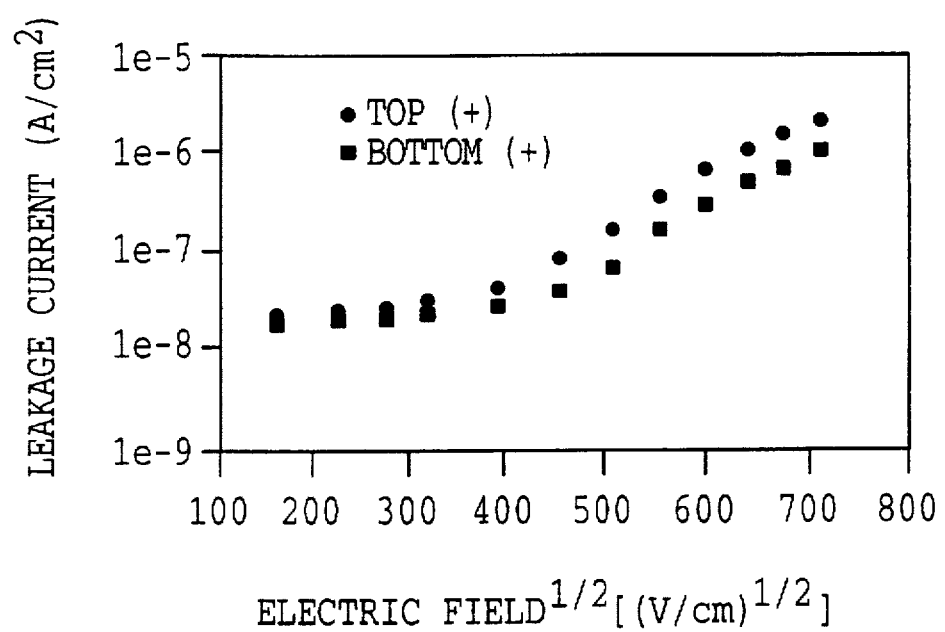
FIG. 5 is a plot of a leakage current versus applied voltage for both polarities of a capacitor according to the present invention.

FIG. 5 shows the dependance of the dc leakage current on applied voltage and polarity (either top electrode+or bottom electrode+), for the test structures on n+Si(100) substrate. The leakage current increased very slightly up to applied filed of 100 kV/cm which is followed by a linear increase up to applied fields of 500 kV/cm (log J versus $E^{1/2}$ dependence). This behavior is indicative of either a Poole-Frankel or Schottky Barrier controlled mechanisms. However, different values of the leakage current with respect to a polarity change during measurement implies that the Schottky barrier is the dominant leakage current mechanism. The leakage current at applied field of 100 kV/cm (3 V) has a low value of $2\times10^{-8}$ A/$cm^2$ and is comparable to PZT on Pt electrodes.

Summarizing, a ferroelectric test capacitor having Pt—Rh—$O_x$/Pt—Rh/Pt—Rh—$O_x$ multilayer electrode-barriers has been deposited on several substrates with excellent ferroelectric and fatigue characteristics. The multilayer electrode structure acts as an excellent barrier between the ferroelectric film and the Si substrate up to high processing temperatures of 700° C. and also significantly improves the degradation properties of these capacitors. The barrier properties of the multilayer electrode structure will allow integrated ferroelectric (for example, PZT, SBT) capacitors, and also high dielectric constant paraelectric) capacitors, for use in large scale integrated memory cell structures.

Figure 6:
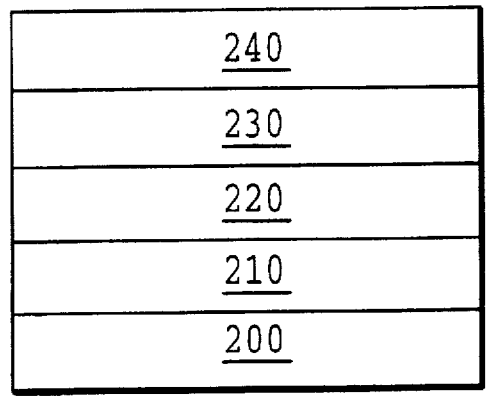
FIG. 6 is a schematic of a general capacitor structure according to the present invention.

Now, it should be understood that the while the above described device has been constructed with excellent results, the present invention is broader than those specific compositions. A general capacitor device is shown schematically in FIG. 6. A capacitor is formed on a substrate 200. While substrate 200 may be of any material suitable for capacitor formation, particularly preferred substrates are silicon, germanium, GaAs, and other semiconductors. A metal oxide layer 210 is formed on the substrate 200. While the metal oxide layer 210 may be any metal oxide, it is in one embodiment most preferably an oxide of a transition metal. More particularly, the following metals are preferred: any transition metal, Pd, Pt, Ir, Rh, and Ru. Silver (Ag) is also a preferred metal. As used anywhere in this document, the term "metal" includes any alloy or other composition including multiple metals, and not merely single element compounds; the term "alloy" may occasionally be used for additional clarity and not to change the meaning. A metal layer 220 is deposited on the metal oxide layer 210. The metal of layer 220 is the same type of metal that is in oxide form in layer 210; thus the same metals are preferred as set forth above. A dielectric layer 230 is formed on the metal layer 220. The dielectric layer 230 is preferably a ferroelectric (e.g., PZT and SBT), or another high dielectric material (e.g., BST). Layers 210 and 220 together form the bottom electrode.

Figure 7:
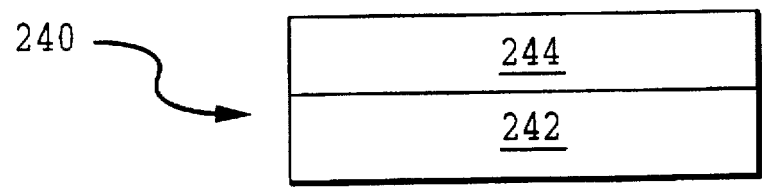
FIG. 7 is a schematic of a top electrode according to an aspect of the invention.

A top electrode 240 is formed on the dielectric 230. Preferably, the top electrode 240 is of the same metal oxide and metal layer structure as the bottom electrode. Thus, a metal layer 242 is formed on the dielectric 230, over which a metal oxide layer 244 is formed (see FIG. 7). However, a different top electrode could be used.

An intermediate metal oxide layer (not shown here) may be used to prevent fatigue, that is particularly useful for the case where the dielectric 230 is PZT. Thus, a metal oxide layer is formed between the metal layer 220 and the dielectric 230. In this case, another metal oxide layer is preferably formed directly above the dielectric 230, which forms an additional component of the top electrode.

The capacitor structure described above is particularly useful for FRAMS (non-volatile memories) and DRAMS. For FRAMS, the following compounds are preferred dielectrics:

$PbZr_{1-x}Ti_xO_3$ (including doped and undoped variants)

$SrBi_2Ta_{1-x}Nb_xO_9$, and solid solutions;

other ferroelectrics. For DRAMS, the following compounds are preferred dielectrics:

$Sr_{1-x}Ba_xTiO_3$;

$BaBi_2Ta_2O_9$ other high dielectric constant material.

What is claimed is:

1. A capacitor comprising: a bottom electrode formed on a substrate, a top electrode, and a dielectric sandwiched between the bottom and top electrodes;

the bottom electrode comprising a layer of metal oxide and a layer of metal on the metal oxide, the metal oxide being formed on said substrate, and the metal the same type of metal as in the metal layer.

2. The capacitor of claim 1, wherein the metal is selected from the group consisting of Pt, Ir, Rh, Ru, Ag, and alloys of the same.

3. The capacitor of claim 1, further comprising a second metal oxide layer sandwiched between said metal layer and said dielectric.

4. The capacitor of claim 3, wherein the dielectric includes PZT.

5. The capacitor of claim 1, wherein the top electrode comprises a metal layer and metal oxide layer formed above the top electrode metal layer.

6. A capacitor comprising:

a bottom electrode formed on a substrate, a top electrode, and a dielectric sandwiched between the bottom and top electrodes;

the bottom electrode comprising a first layer of Pt—Rh—$O_x$ a second layer of Pt—Rh, and a third layer of Pt—Rh—$O_x$, the third layer being adjacent the dielectric.

7. The capacitor of claim 6, wherein the dielectric is a ferroelectric.

8. The capacitor of claim 7, wherein the top electrode comprises a first layer of Pt—Rh—$O_x$ a second layer of Pt—Rh, and a third layer of Pt—Rh—$O_x$, the first layer being adjacent to the dielectric.

9. The capacitor of claim 6, wherein the bottom electrode first layer has a thickness of about 15 nm, the bottom electrode second layer has a thickness of about 50 nm, and the bottom electrode third layer has a thickness of about 30 nm.

10. The capacitor of claim 6, wherein the bottom electrode first layer is about Pt—13%Rh.

11. The capacitor of claim 6, wherein the bottom electrode first layer has an atomic composition of Pt:Rh:O of 66:14:20; the second layer has an atomic composition of Pt:Rh of about 87:13; and the third layer has an atomic composition of Pt:Rh:O of about 50:20:30.

12. The capacitor of claim 6, wherein the substrate comprises at least one of silicon, germanium, GaAs, or another semiconductor.

13. The capacitor of claim 12, wherein the substrate is selected from the group consisting of n$^+$Si(100), n$^+$polysilicon/SiO$_2$/Si, and SiO$_2$/Si.

14. A DRAM, comprising:

a capacitor having a bottom electrode formed on a substrate, a top electrode, and a dielectric sandwiched between the bottom and top electrodes;

the bottom electrode comprising a layer of metal oxide and a layer of metal on the metal oxide, the metal oxide being formed on said substrate, and the metal oxide including the same type of metal as in the metal layer; wherein the dielectric is selected from the group consisting of $Sr_{1-x}Ba_xTiO_3$, $BaBi_2Ta_2O_9$, and high dielectric materials.

* * * * *